United States Patent
Li et al.

(10) Patent No.: US 11,119,373 B2
(45) Date of Patent: Sep. 14, 2021

(54) ARRAY SUBSTRATE, METHOD OF MANUFACTURING THE SAME AND DISPLAY DEVICE

(71) Applicants: BOE Technology Group Co., Ltd., Beijing (CN); Chongqing BOE Optoelectronics Technology Co., Ltd., Chongqing (CN)

(72) Inventors: Yunze Li, Beijing (CN); Ni Yang, Beijing (CN); Qian Tan, Beijing (CN); Zhongfei Dong, Beijing (CN); Xiaoyuan Wang, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 310 days.

(21) Appl. No.: 16/118,252

(22) Filed: Aug. 30, 2018

(65) Prior Publication Data
US 2019/0235331 A1     Aug. 1, 2019

(30) Foreign Application Priority Data
Jan. 31, 2018   (CN) .......................... 201810094721.1

(51) Int. Cl.
*G02F 1/1362*   (2006.01)
*H01L 27/12*    (2006.01)
(Continued)

(52) U.S. Cl.
CPC ...... *G02F 1/136286* (2013.01); *G02F 1/1368* (2013.01); *G02F 1/13338* (2013.01);
(Continued)

(58) Field of Classification Search
CPC ......... G02F 1/136286; G02F 1/136204; G02F 1/1343; G02F 1/13338; G02F 1/1368;
(Continued)

(56) References Cited

U.S. PATENT DOCUMENTS 6,297,862 B1 * 10/2001 Murade ............ G02F 1/136209
349/44
9,741,744 B2   8/2017 Xi et al.
(Continued)

FOREIGN PATENT DOCUMENTS

CN        103246099 A     8/2013
CN        104182084 A    12/2014
(Continued)

OTHER PUBLICATIONS

Office Action issued in corresponding Chinese Patent Application No. 201810094721.1, dated Feb. 6, 2020.

*Primary Examiner* — Fred Tzeng
(74) *Attorney, Agent, or Firm* — McDermott Will & Emery LLP (57) ABSTRACT

An array substrate, a method of manufacturing the same, and a display device are provided. The array substrate includes a base substrate; a plurality of thin film transistors on the base substrate; and a plurality of light shielding layers on a side of the plurality of thin film transistors facing away from the base substrate, each thin film transistor includes an active layer, at least a portion of the active layer serves as a channel of the thin film transistor, and an orthogonal projection of each of the light shielding layers on the base substrate at least partially overlaps an orthogonal projection of the channel of one of the plurality of thin film transistors on the base substrate.

15 Claims, 8 Drawing Sheets

(51) Int. Cl.
  *H01L 27/02* (2006.01)
  *H01L 29/786* (2006.01)
  *G02F 1/1368* (2006.01)
  *G02F 1/1333* (2006.01)
  *G06F 3/041* (2006.01)
  *G06F 3/044* (2006.01)
  *G02F 1/1343* (2006.01)
  *G02F 1/1339* (2006.01)
  *G02F 1/136* (2006.01)

(52) U.S. Cl.
  CPC .. *G02F 1/136204* (2013.01); *G02F 1/136209* (2013.01); *G06F 3/044* (2013.01); *G06F 3/0412* (2013.01); *H01L 27/0292* (2013.01); *H01L 27/124* (2013.01); *H01L 27/1259* (2013.01); *H01L 29/78609* (2013.01); *H01L 29/78633* (2013.01); *G02F 1/13394* (2013.01); *G02F 1/13606* (2021.01); *G02F 1/134363* (2013.01); *G02F 1/136295* (2021.01); *G06F 2203/04103* (2013.01); *G06F 2203/04107* (2013.01)

(58) Field of Classification Search
  CPC .... G02F 3/044; G02F 3/0412; G02F 1/13439; H01L 27/0292; H01L 27/124; H01L 27/1248; H01L 27/1259; H01L 29/78609; H01L 29/78633; H01L 29/66757; H01L 29/78696

USPC .......................................................... 345/174
  See application file for complete search history.

(56) References Cited

U.S. PATENT DOCUMENTS

| | | | |
|---|---|---|---|
| 2017/0104105 A1* | 4/2017 | Ma | H01L 29/78696 |
| 2017/0269283 A1* | 9/2017 | Wang | G02B 6/0055 |
| 2017/0276989 A1* | 9/2017 | Lin | G02F 1/13338 |
| 2018/0005007 A1* | 1/2018 | Du | G06K 9/2036 |
| 2018/0074623 A1* | 3/2018 | Xi | G06F 3/03545 |
| 2018/0102382 A1* | 4/2018 | Peng | G02F 1/13439 |
| 2019/0064985 A1* | 2/2019 | Zhu | G02F 1/1343 |
| 2019/0067403 A1* | 2/2019 | Song | H01L 29/78633 |
| 2019/0148561 A1* | 5/2019 | Ban | H01L 29/66757 257/72 |
| 2019/0165001 A1* | 5/2019 | Yao | H01L 27/124 |
| 2019/0214504 A1* | 7/2019 | Song | H01L 29/78633 |
| 2019/0229017 A1* | 7/2019 | Liu | H01L 27/1248 |
| 2020/0176477 A1* | 6/2020 | Liu | G02F 1/13338 |

FOREIGN PATENT DOCUMENTS

| | | |
|---|---|---|
| CN | 105810717 A | 7/2016 |
| CN | 106098709 A | 11/2016 |
| GB | 2508988 A | 6/2014 |

* cited by examiner

ARRAY SUBSTRATE, METHOD OF MANUFACTURING THE SAME AND DISPLAY DEVICE

CROSS-REFERENCE TO RELATED APPLICATION

This application claims priority to Chinese Patent Application No. 201810094721.1 filed on Jan. 31, 2018 in the State Intellectual Property Office of China, the disclosure of which is hereby incorporated by reference in its entirety.

TECHNICAL FIELD

The present disclosure relates to the field of display technologies, and in particular, to an array substrate, a method of manufacturing the same, and a display device.

DESCRIPTION OF THE RELATED ART

Thin film transistor liquid crystal display (abbreviated as TFT-LCD) is one of the current mainstream types of displays. Touch and display driver integrate (abbreviated as TDDI) display receives much attention as one type of TFT-LCD. In the TDDI display, a touch pattern metal layer including a plurality of touch lines is integrated on the array substrate to simultaneously implement display and touch functions.

SUMMARY

An embodiment of the present disclosure provides an array substrate comprising: a base substrate; a plurality of thin film transistors on the base substrate; and a plurality of light shielding layers on a side of the plurality of thin film transistors facing away from the base substrate, wherein each thin film transistor comprises an active layer, at least a portion of the active layer serves as a channel of the thin film transistor, and an orthogonal projection of each of the light shielding layers on the base substrate at least partially overlaps an orthogonal projection of the channel of one of the plurality of thin film transistors on the base substrate.

In some embodiments, the array substrate further comprising: a lead wire configured to ground the plurality of light shielding layers.

In some embodiments, the array substrate further comprising: a plurality of touch lines on the side of the plurality of thin film transistors facing away from the base substrate, wherein the plurality of light shielding layers and the plurality of touch lines are disposed in the same layer and made of the same material.

In some embodiments, the array substrate further comprising: a plurality of touch lines on the side of the plurality of thin film transistors facing away from the base substrate, wherein the plurality of light shielding layers, the lead wire and the plurality of touch lines are disposed in the same layer and made of the same material.

In some embodiments, the plurality of light shielding layers are arranged in an array, and the lead wire comprises: a plurality of first lead wires, wherein each of the first lead wires extends in a first direction for electrically connecting at least two light shielding layers in one row; and at least one second lead wire extending in a second direction crossing the first direction for electrically connecting at least one of the plurality of first lead wires, the second lead wire being electrically connected with a ground line.

In some embodiments, the array substrate further comprising: a plurality of gate lines extending in the first direction, wherein an orthogonal projection of each of the plurality of first lead wires on the base substrate does not overlap an orthogonal projection of any of the plurality of gate lines on the base substrate.

In some embodiments, the array substrate further comprising: a plurality of data lines extending in the second direction, wherein an orthogonal projection of the at least one second lead wire on the base substrate does not overlap an orthogonal projection of any of the plurality of data lines on the base substrate.

In some embodiments, the array substrate further comprising: a plurality of touch lines on the side of the plurality of thin film transistors facing away from the base substrate and extending in the second direction, wherein the plurality of light shielding layers, the lead wire and the plurality of touch lines are disposed in the same layer and made of the same material, and the at least one second lead wire is disposed between each two adjacent touch lines so that the plurality of first lead wires does not cross the plurality of touch lines.

In some embodiments, the ground line and the plurality of gate lines are disposed in the same layer and made of the same material, and the at least one second lead wire is electrically connected to the ground line through a via hole.

In some embodiments, the orthogonal projection of each of the light shielding layers on the base substrate completely covers the orthogonal projection of the channel of one of the plurality of thin film transistors on the base substrate.

In some embodiments, the plurality of light shielding layers are electrically insulated from the plurality of touch lines.

In some embodiments, a line width of each of the plurality of first lead wires is smaller than a line width of each of the plurality of gate lines.

In some embodiments, a line width of the at least one second lead wire is smaller than a line width of each of the plurality of data lines.

An embodiment of the present disclosure provides a method of manufacturing an array substrate, comprising: providing a base substrate; forming a plurality of thin film transistors on the base substrate; and forming a plurality of light shielding layers on a side of the plurality of thin film transistors facing away from the base substrate, wherein each thin film transistor comprises an active layer, at least a portion of the active layer serves as a channel of the thin film transistor, and an orthogonal projection of each of the light shielding layers on the base substrate at least partially overlaps an orthogonal projection of the channel of one of the plurality of thin film transistors on the base substrate.

In some embodiments, the method further comprising: forming a lead wire on the side of the plurality of thin film transistors facing away from the base substrate, wherein the plurality of light shielding layers are grounded by the lead wire.

In some embodiments, the method further comprising: forming a plurality of touch lines on the side of the plurality of thin film transistors facing away from the base substrate, wherein the plurality of light shielding layers and the plurality of touch lines are formed of the same material through one patterning process.

In some embodiments, the method further comprising: forming a plurality of touch lines on the side of the plurality of thin film transistors facing away from the base substrate, wherein the plurality of light shielding layers, the lead wire and the plurality of touch lines are formed of the same material through one patterning process.

In some embodiments, the plurality of light shielding layers are arranged in an array, forming the lead wire on the side of the plurality of thin film transistors facing away from the base substrate comprises: forming a plurality of first lead wires extending in the first direction and at least one second lead wire extending in the second direction through one patterning process, wherein the first direction crosses the second direction, each of the first lead wires is configured to electrically connect at least two light shielding layers in one row, the at least one second lead wire is configured to electrically connect at least one of the plurality of first lead wires, and the at least one second lead wire is grounded.

An embodiment of the present disclosure provides a display device comprising the array substrate of the above embodiments.

BRIEF DESCRIPTION OF THE DRAWINGS

In order to illustrate the technical solutions of the embodiments of the present disclosure more clearly, the drawings referred to in the embodiments will be briefly described below. It is obvious that the drawings in the following description are only some embodiments of the present disclosure. Those skilled in the art may also obtain other drawings based on these drawings without paying any creative work.

DETAILED DESCRIPTION OF THE EMBODIMENTS

For the TDDI display, a thin film transistor as an important component, the stability of its switching characteristic is very important for the normal operation of the display. The on-state current Ion of the thin film transistor determines whether a pixel storage capacitor in the TDDI display may be charged within a limited charging period in order to achieve an operating voltage required for normal display. The off-state current Ioff of the thin film transistor determines whether the pixel voltage may maintain the operating voltage required for normal display within one frame of scanning time. Too large off-state current Ioff causes too fast pixel voltage loss or writing other wrong signals, thereby resulting in defects on the display image, such as stain which is a phenomenon that shows uneven brightness, ghost image, crosstalk and the like. Therefore, reducing the off-state current Ioll of the thin film transistor is of great significance for improving the display quality of the TDDI display.

The inventors of the present disclosure have found through research that the off-state current Ioff of the thin film transistor may be increased under the influence of the internal factors of the thin film transistor itself as well as the influence of external factors as follows.

Figure 1:
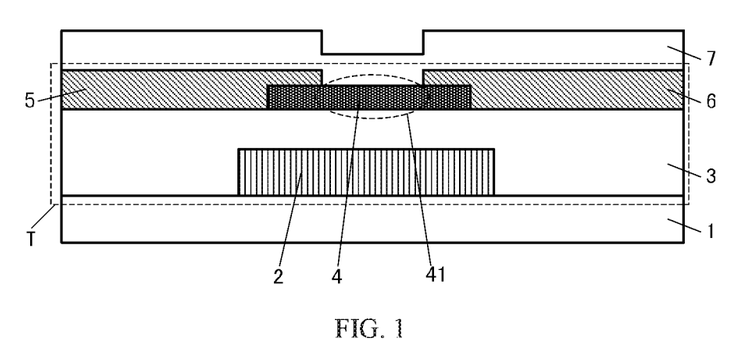
FIG. 1 is a schematic cross-sectional view of a thin film transistor in an array substrate.
Figure 2:
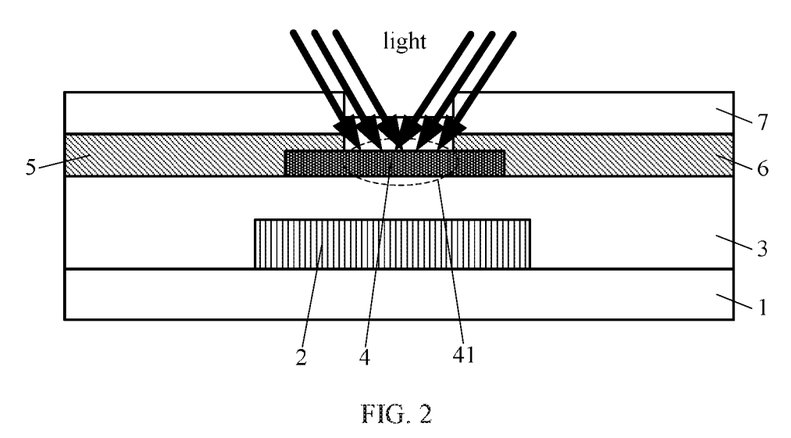
FIG. 2 is a schematic view showing that a channel of the thin film transistor of FIG. 1 is illuminated.
Figure 3:
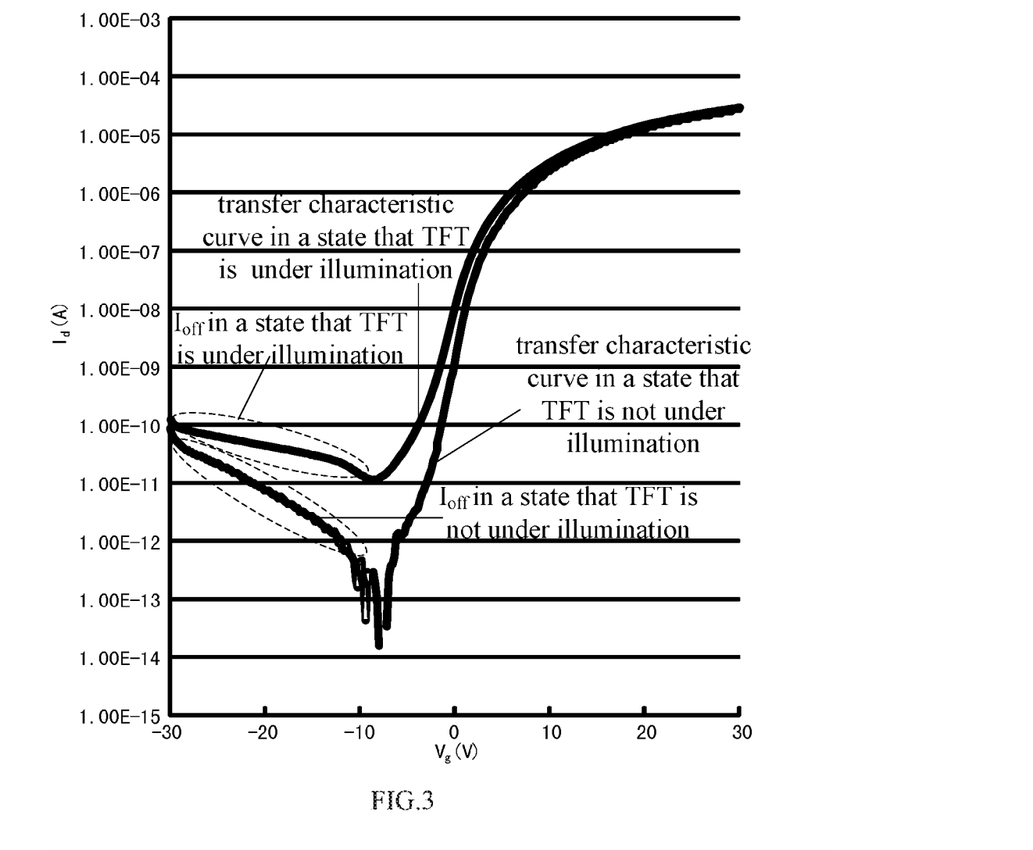
FIG. 3 is a graph showing transfer characteristic curves of the thin film transistor in a state that the thin film transistor is not under illumination and in a state that the thin film transistor is under illumination.

(1) Illumination factor. FIG. 1 is a cross-sectional structural view of a thin film transistor in an array substrate, and FIG. 2 is a schematic view showing a channel of the thin film transistor of FIG. 1 being illuminated. As shown in FIGS. 1 and 2, the thin film transistor T includes a gate electrode 2, a gate insulating layer 3, an active layer 4, a source/drain electrode layer including the source electrode 5 and the drain electrode 6, sequentially formed on a base substrate 1, and a passivation layer 7 is formed on the thin film transistor T. At least a portion of the active layer 4 serves as a channel 41 of the thin film transistor T. The film layers including the passivation layer 7 above the channel 41 of the thin film transistor T are all transparent film layers, so that the portion of the active layer 4 as the channel 41 is exposed. When obliquely incident or reflective light is incident on the channel 41, photo-generated carriers are generated, resulting in an increase in the off-state current Ioll of the thin film transistor. FIG. 3 is a graph showing transfer characteristic curves of a thin film transistor in a state that the thin film transistor is not under illumination and in a state the thin film transistor is under illumination. The transfer characteristic curve of the thin film transistor reflects a relationship between a drain current Id of the thin film transistor and a voltage Vg between a gate electrode and a source electrode of the thin film transistor when a voltage between the source electrode and a drain electrode of the thin film transistor is a predetermined value, and a portion before the inflection point of the transfer characteristic curve may be regarded as a curve of the off-state current Ioff of the thin film transistor. As shown in FIG. 3, the off-state current Ioll in the state that the thin film transistor is under illumination is significantly higher than the off-state current Ioff in the state that the thin film transistor is not under illumination.

It should be noted that the "channel" in the embodiments of the present disclosure refers to an active layer region, which is at least a portion of the active layer, for conducting the source electrode and the drain electrode when the thin film transistor is under an action of an applied electric field.

Figure 4:
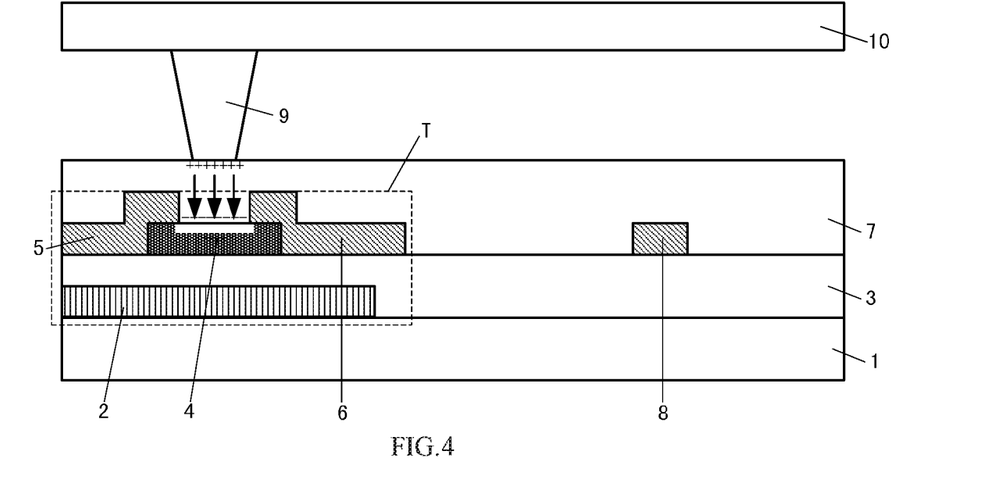
FIG. 4 is a schematic view showing that a film layer above the thin film transistor is rubbed by a spacer.
Figure 5:
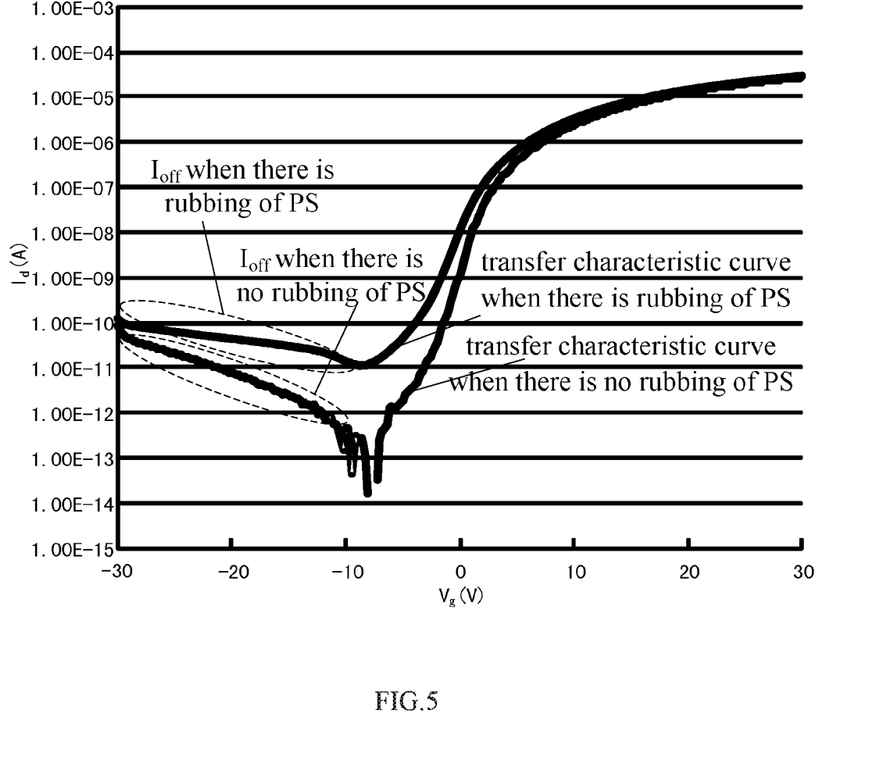
FIG. 5 is a graph showing transfer characteristic curves of the thin film transistor when there is rubbing of the spacer and when there is no rubbing of the spacer.

(2) Rubbing factor of spacers. FIG. 4 is a schematic view showing that a film layer above the thin film transistor is rubbed by a spacer. As shown in FIG. 4, in many types of displays, a spacer 9 such as a photo spacer (abbreviated as PS) on a color filter (abbreviated as CF) substrate 10 is abutted against the thin film transistor T in the array substrate. The spacer 9 is rubbed against the film layer (e.g. the passivation layer 7 in FIG. 4) above the thin film transistor T by an external force to generate electrostatic charges. The electrostatic charges may not be discharged and may be accumulated, thereby forming an internal electric field between the spacer 9 and the active layer 4. As a result, the electrostatic charges are generated at an interface where the active layer 4 of the thin film transistor T contacts the passivation layer 7, resulting in an increase in the off-state current Ioff of the thin film transistor T. FIG. 5 is a graph showing transfer characteristic curves of the thin film transistor when there is rubbing of the spacer and when there is no rubbing of the spacer. The transfer characteristic curve of the thin film transistor reflects a relationship between a drain current Id of the thin film transistor and a voltage Vg between a gate electrode and a source electrode of the thin film transistor when a voltage between the source electrode and a drain electrode of the thin film transistor is a predetermined value, and a portion before the inflection point of the transfer characteristic curve may be regarded as a curve of the off-state current Ioff of the thin film transistor. As shown in FIG. 5, the off-state current Ioff when the spacer is rubbed against the thin film transistor T to generate electrostatic charges is significantly higher than the off-state current Ioff when there is no rubbing of the spacer.

Based on the above researches, the inventors propose the following technical solutions in the present disclosure.

In one solution, in view of the problem that the illumination factor as described above causes an increase in the off-state current Ioff of the thin film transistor, a light shielding layer may be disposed over the channel of the active layer of the thin film transistor to shield the channel of the thin film transistor so as to avoid generation of photo-generated carriers in the channel, thereby reducing the off-state current Ioff of the thin film transistor.

Further, in view of the problem that the electrostatic charges generated by rubbing of the spacer as described above causes an increase in the off-state current Ioff of the thin film transistor, a lead wire may be provided, the lead wire is connected to the light shielding layer and grounded to discharge the electrostatic charges generated by the rubbing of the spacer against the film layer above the thin film transistor T, thereby avoiding the accumulation of electrostatic static charges and reducing the off-state current Ioll of the thin film transistor.

Since the array substrate of the TDDI display device includes a touch pattern metal layer, the light shielding layer and touch lines of the touch pattern metal layer may be formed through the same patterning process according to the above solution, thereby reducing the off-state current Ioff of the thin film transistor without increasing patterning processes.

Further, the light shielding layer, the lead wire and the touch lines may be formed through the same patterning process, thereby further reducing the off-state current Ioll of the thin film transistor without increasing patterning processes.

In order to make objects, features and advantages of the present disclosure more clearly understood, technical solutions in the embodiments of the present disclosure will be clearly and completely described below in conjunction with the accompanying drawings. It is apparent that the described embodiments are only a part of the embodiments of the present disclosure, and not all of them. All other embodiments obtained by those skilled in the art based on the embodiments of the present disclosure without creative efforts are within the scope of the present disclosure.

The technical solutions provided by the embodiments of the present disclosure can be applied to various types of display devices. Hereinafter, embodiments of the present disclosure will be described in detail by taking an array substrate of a TDDI display device as an example.

Figure 6:
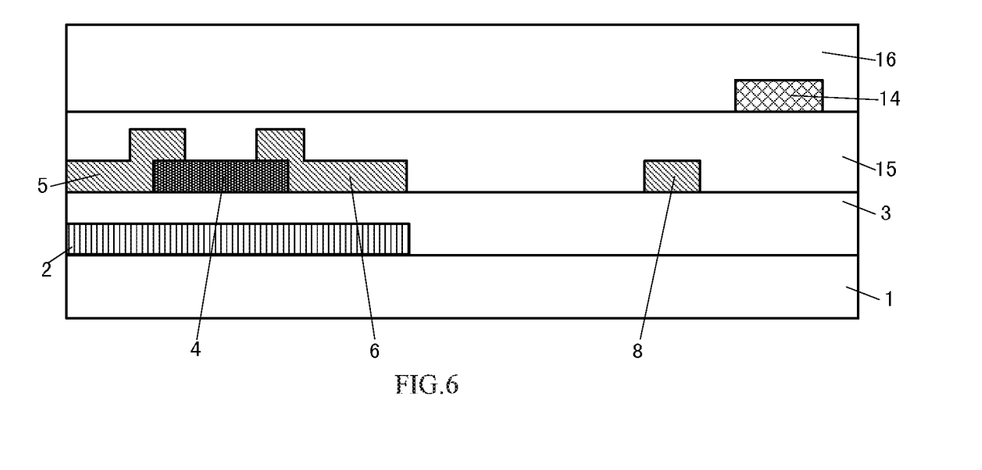
FIG. 6 is a schematic cross-sectional view of an array substrate of a TDDI display device.
Figure 7:
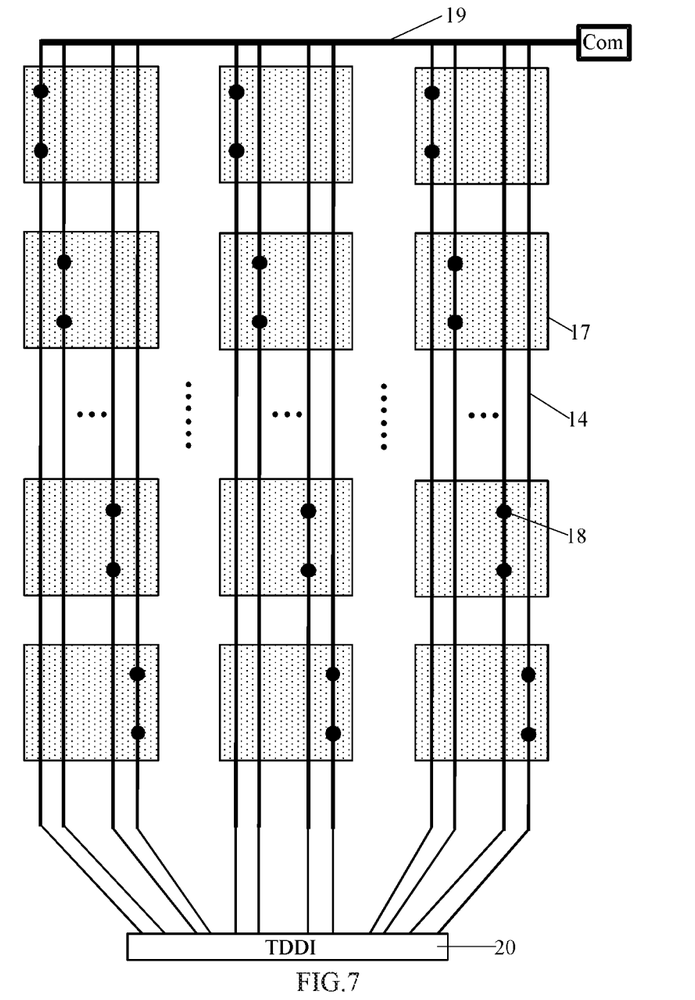
FIG. 7 is a schematic plan view of a layout of touch lines in the array substrate of the TDDI display device.

First, a structure of an array substrate of the TDDI display device will be described. FIG. 6 is a schematic cross-sectional view of the array substrate of the TDDI display device, and FIG. 7 is a schematic plan view of a layout of touch lines in the array substrate of the TDDI display device. As shown in FIGS. 6 and 7, the array substrate of the TDDI display device includes a gate metal layer including a gate electrode 2 and a gate line, a gate insulating layer 3, and an active layer 4, a pixel electrode layer including a pixel electrode, a source/drain metal layer including a source electrode 5, the drain electrode 6 and a data line 8, a first passivation layer 15, and a touch pattern metal layer including a touch line 14, a second passivation layer 16 and a common electrode 17 sequentially disposed on a base substrate 1. The touch pattern metal layer includes a plurality of touch lines 14 arranged in parallel, each of the touch lines 14 corresponds to one common electrode 17, and each of the touch lines 14 is connected to the corresponding common electrode 17 through a via hole 18. Each of the touch lines 14 is connected to a common electrode line 19, and each of the touch lines 14 is connected to a TDDI chip 20. In an example, one common electrode 17 may correspond to a plurality of pixel electrodes. On the one hand, the common electrode 17 cooperates with the pixel electrodes to implement a display function, and on the other hand, the common electrode 17 may also serve as a touch electrode to cooperate with the touch lines 14 to implement a touch function. The common electrode 17 is time-multiplexed by the TDDI chip 20 to implement display and touch functions. For example, when a certain position of the display device is touched, the corresponding common electrode 17 forms a sensing signal, and the sensing signal is transmitted to the TDDI chip 20 via the corresponding touch line 14, and the TDDI chip 20 performs positioning calculation according to the sensing signal to implement the touch function.

The present embodiment provides the following technical solutions based on the array substrate of the TDDI display device.

Figure 8:
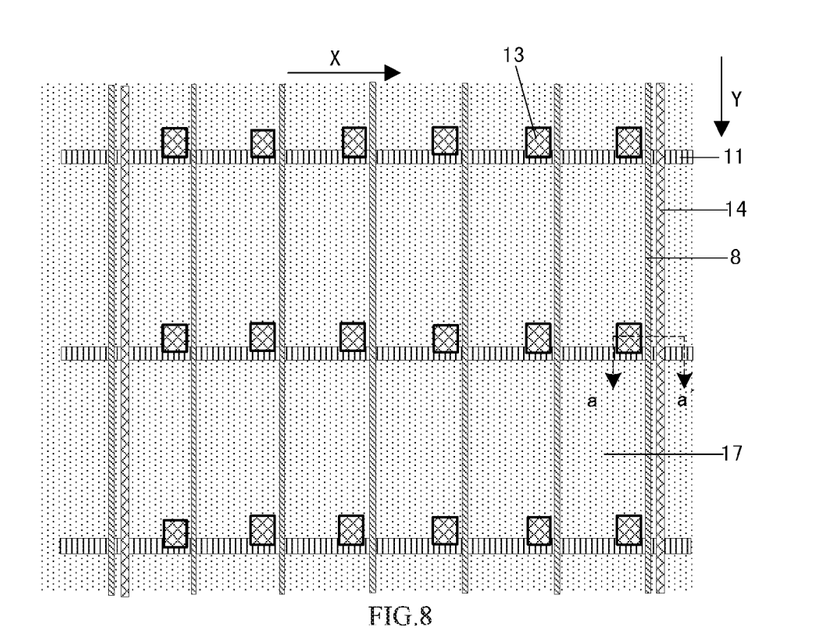
FIG. 8 is a schematic plan view of an array substrate according to an embodiment of the present disclosure.
Figure 9:
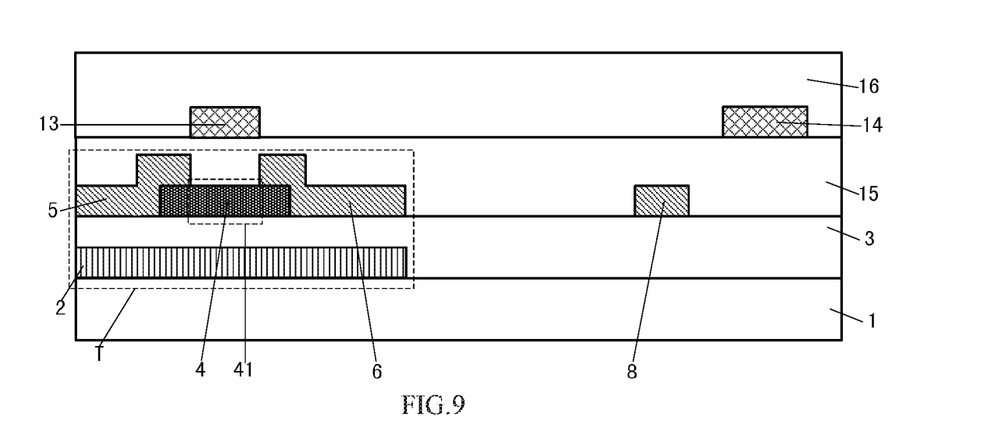
FIG. 9 is a schematic cross-sectional view taken along line aa' of FIG. 8.

An embodiment of the present disclosure provides an array substrate, FIG. 8 is a schematic plan view of an array substrate according to an embodiment of the present disclosure, and FIG. 9 is a schematic cross-sectional view taken along line aa' of FIG. 8. As shown in FIG. 8 and FIG. 9, the array substrate includes a base substrate 1, a plurality of thin film transistors T disposed on the base substrate 1, and a touch pattern metal layer disposed on a side of the plurality of thin film transistors T facing away from the base substrate 1. Specifically, the array substrate includes a gate metal layer including a gate electrode 2 and a gate line, a gate insulating layer 3, an active layer 4, a pixel electrode layer including a pixel electrode, a source/drain metal layer including a source electrode 5, the drain electrode 6 and a data line 8, a first passivation layer 15, the touch pattern metal layer, a second passivation layer 16 and a common electrode 17 sequentially disposed on the base substrate 1. The plurality of thin film transistors T of the array substrate are arranged in an array, a row direction of the array is a first direction X, and a column direction of the array is a second direction Y. The first direction and the second direction may cross each other, for example, perpendicular to each other. The array substrate further includes a plurality of gate lines 11 extending in the first direction X and a plurality of data lines 8 extending in the second direction Y. The thin film transistor T further includes an active layer 4, and at least a portion of the active layer 4 serves as a channel 41 of the thin film transistor T. The touch pattern metal layer includes a plurality of touch lines 14 and a plurality of light shielding layers 13. The plurality of touch lines 14 of the array substrate extend in the second direction Y. An orthogonal projection of each of the light shielding layers 13 on the base substrate 1 at least partially overlaps an orthogonal projection of the channel 41 of a corresponding thin film transistor T on the base substrate 1, so that the light shielding layer 13 may prevent light from irradiating onto the channel 41 of the corresponding thin film transistor T, thereby reducing generation of photo-generated carriers in the channel, and reducing the off-state current Ioff of the thin film transistor T. Moreover, the light shielding layer 13 and the touch line 14 are formed in the same layer (i.e. the touch pattern metal layer), that is, the light shielding layer 13 and the touch line 14 may be formed through the same patterning process, thereby reducing the off-state current Ioff of the thin film transistor without additionally adding a process for manufacturing the light shielding layer 13.

In this embodiment, electrical insulation between the light shielding layer 13 and the touch line 14 is required to prevent the light shielding layer 13 from interfering with signals transmitted on the touch line 14.

Since the light shielding layer 13 and the touch line 14 are formed by the same patterning process, they are made of the same material. The material for manufacturing the light shielding layer 13 may be a material having good light shielding properties, for example a metal material such as nickel or chromium and the like.

Based on the above technical solution, in order to further enhance the shielding effect of the light shielding layer 13 on the channel, each of the light shielding layers 13 may completely cover the channel 41 of the corresponding thin film transistor T. That is, the orthogonal projection of the channel 41 of the thin film transistor T on the base substrate 1 completely falls within the orthogonal projection of the corresponding light shielding layer 13 on the base substrate 1. In this case, the light shielding layer 13 may completely shield the channel 41 of the corresponding thin film transistor T to minimize the generation of photo-generated carriers.

Based on the array substrate provided by the above embodiments, an embodiment of the present disclosure further provides a method of manufacturing the above array substrate. Referring again to FIG. 9, the method includes the following steps:

S1: providing a base substrate and forming a plurality of thin film transistors T on the base substrate 1; and S2: forming a touch pattern metal layer on a side of the plurality of thin film transistors T facing away from the base substrate 1.

In the step S1, each of the thin film transistors includes an active layer 4, and at least a portion of the active layer 4 serves as a channel 41 of the thin film transistor T.

In the step S2, the touch pattern metal layer includes a plurality of touch lines 14 and a plurality of light shielding layers 13, and an orthogonal projection of each of the light shielding layers 13 on the base substrate 1 at least partially overlaps an orthogonal projection of the channel 41 of a corresponding thin film transistor T on the base substrate 1.

In this way, the light shielding layer 13 may prevent the light from irradiating onto the channel 41 of the thin film transistor T to reduce the off-state current Ioff of the thin film transistor. Moreover, a process for manufacturing the light shielding layer 13 is compatible with a process for manufacturing the touch line 14, so that it is not necessary to additionally add the process for manufacturing the light shielding layer 13.

Figure 10:
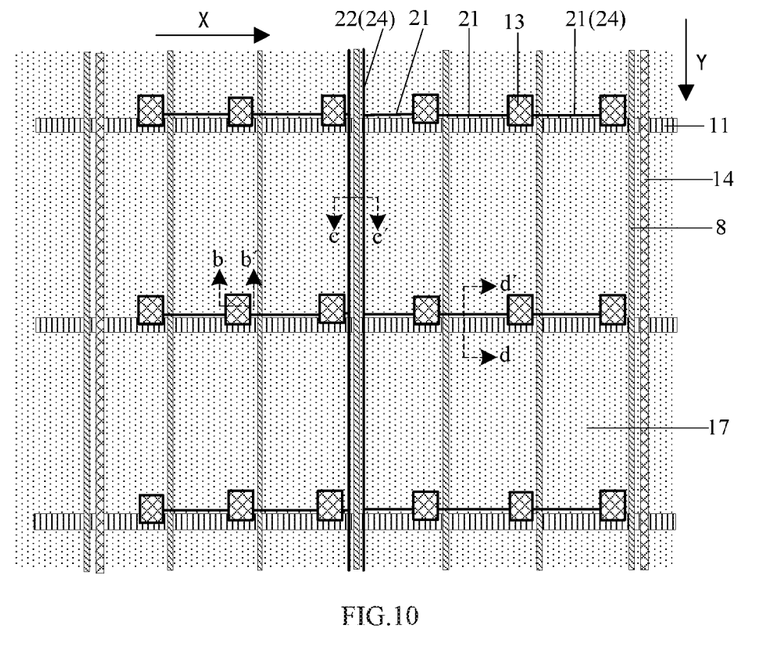
FIG. 10 is a schematic plan view of an array substrate according to an embodiment of the present disclosure.
Figure 11:
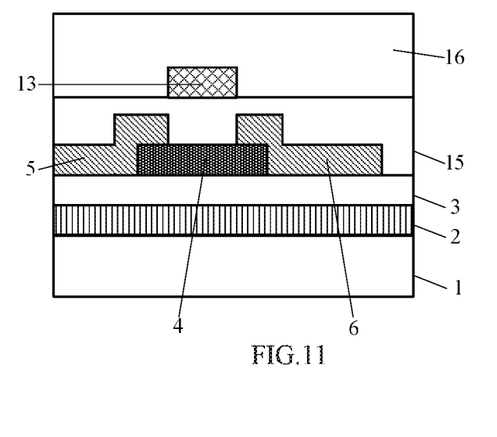
FIG. 11 is a schematic cross-sectional view taken along line bb' of FIG. 10.
Figure 12:
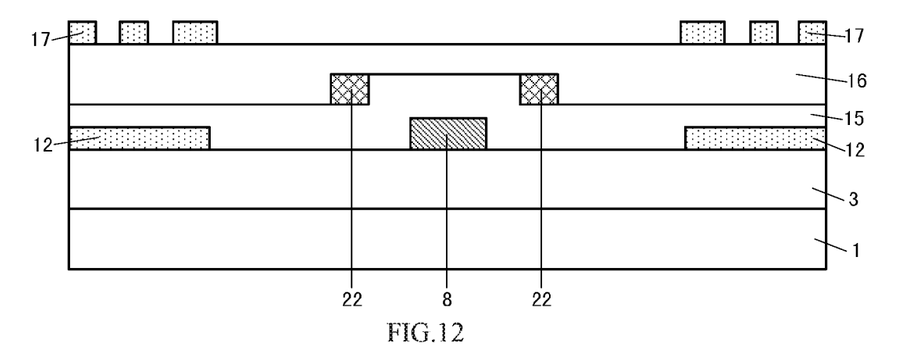
FIG. 12 is a schematic cross-sectional view taken along line cc' of FIG. 10.
Figure 13:
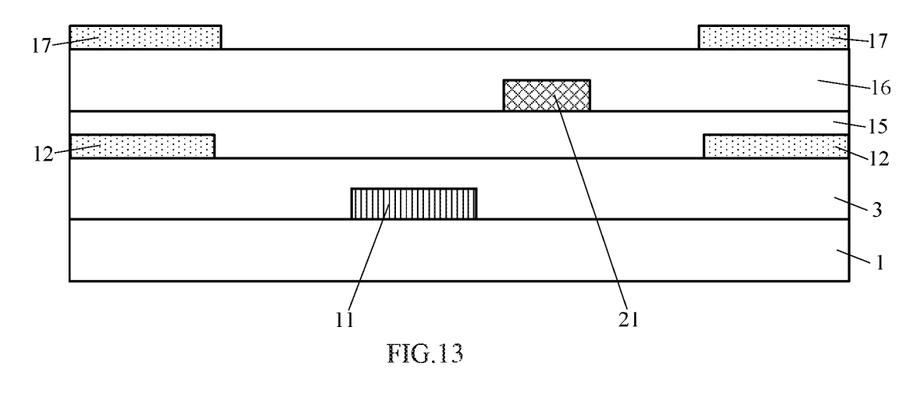
FIG. 13 is a schematic cross-sectional view taken along line dd' of FIG. 10.

An embodiment of the present disclosure provides an array substrate, which is substantially the same as the array substrate provided in the previous embodiment. FIG. 10 is a schematic plan view of the array substrate according to an embodiment of the present disclosure, and FIGS. 11-13 are schematic cross-sectional views taken along line bb', line cc', and line dd' of FIG. 10, respectively. Referring to FIGS. 10-13, the array substrate of this embodiment is different from that of the previous embodiment in that: besides the plurality of touch lines 14 and the plurality of light shielding layers 13, the touch pattern metal layer further includes a lead wire 24. The lead wire 24 includes a plurality of first lead wires 21 and at least one second lead wire 22. Each of the plurality of first lead wires 21 extends in the first direction X for electrically connecting at least two of light shielding layers 13 corresponding to one row of the thin film transistors T. The at least one second lead wire 22 extends in the second direction Y for electrically connecting at least one of the plurality of first lead wires 21, and the at least one second lead wire 22 is grounded.

With such a structure, when a spacer is rubbed against the film layer above the thin film transistor T to generate electrostatic charges, the electrostatic charges accumulated in the light shielding layer 13 may be led out through the second lead wire 22 and the first lead wire 21, thereby avoiding the increase in the off-state current Ioff of the thin film transistor T, which is caused by the generation of the electrostatic charges due to the rubbing of the spacer.

In addition, the first lead wire 21, the second lead wire 22, the light shielding layer 13 and the touch line 14 are formed in the same film layer (i.e. the touch pattern metal layer), such that the process for manufacturing the first lead wire 21, the second lead wire 22 and the light shielding layer 13 may be compatible with the process for manufacturing the touch line 14, so as not to increase the number of processes.

In an embodiment, the second lead wire 22 can be disposed outside an opening area of a pixel as much as possible to avoid influencing on the pixel aperture ratio. In an embodiment, an orthogonal projection of the second lead wire 22 on the base substrate 1 does not overlap an orthogonal projection of the data line 8 on the base substrate 1, that is, the second lead wire 22 is disposed beside the data line 8 instead of directly above the data line so as to avoid them overlapping each other, thereby reducing parasitic capacitance between the second lead wire 22 and the data line 8.

Similarly, in an embodiment, the first lead wire 21 can be disposed outside the opening area of the pixel as much as possible to avoid influencing on the pixel aperture ratio. In an embodiment, an orthogonal projection of the first lead wire 21 on the base substrate 1 does not overlap an orthogonal projection of the gate line 11 on the base substrate 1, that is, the first lead wire 21 is disposed beside the gate line 11 instead of directly above the gate line so as to avoid them overlapping each other, thereby reducing parasitic capacitance between the first lead wire 21 and the gate line 11.

In an embodiment, in order to avoid the first lead wires 21 crossing the touch lines 14, it is possible to provide at least one second lead wire 22 between each two adjacent touch lines 14. Thus, the first lead wires 21 between two adjacent touch lines 14 may be connected to the second lead wire 22 between the two adjacent touch lines 14 to be grounded, thereby effectively avoiding the first lead wires 21 crossing the touch lines 14.

In a technical solution provided by an embodiment, since the first lead wire 21 and the second lead wire 22 function to discharge the electrostatic charges, generated by the rubbing of the spacer, from the light shielding layer 13, when the first lead wire 21 and the second lead wire 22 are designed, it is only necessary to consider the conduction between the first lead wire 21 and the second lead wire so as to ensure that the electrostatic charges may be smoothly discharged without considering the factors of loss and crosstalk. Therefore, line widths of the first lead wire 21 and the second lead wire 22 may be set relatively narrow. For example, a line width of the first lead wire 21 may be smaller than a line width of the gate line 11, and a line width of the second lead wire 22 may be smaller than a line width of the data line 8 so as to avoid affecting the pixel aperture ratio.

In an embodiment, as shown in FIG. 12, an orthogonal projection of the pixel electrode 12 on the base substrate 1 at least partially overlaps an orthogonal projection of the corresponding common electrode 17 on the base substrate 1, and at least one of the pixel electrode 12 and the common electrode 17 is designed as a strip electrode. For example, the common electrode 17 is a strip electrode, the pixel electrode 12 is a planar electrode, or the common electrode 17 is a planar electrode, the pixel electrode 12 is a strip electrode, or the common electrode 17 and the pixel electrode are both strip electrodes.

Figure 14:
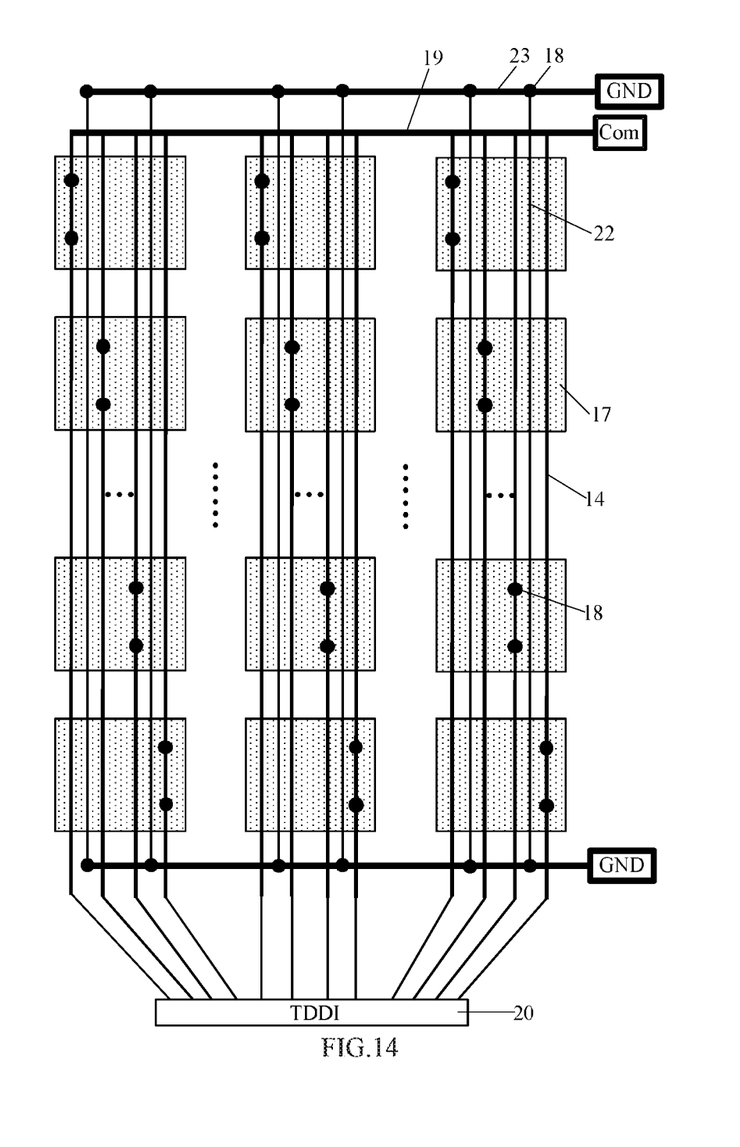
FIG. 14 is a plan view of a layout of an array substrate according to an embodiment of the present disclosure.

FIG. 14 is a plan view of a layout of an array substrate according to an embodiment of the present disclosure. Referring to FIG. 14, in the technical solution provided in this embodiment, in order to round the second lead wire 22, the second lead wire 22 may be connected to a ground line (abbreviated as GND) 23. In an embodiment, the ground line 23 of the array substrate is disposed in the same layer and formed of the same material as the gate electrode 2 and the gate line 11. That is, the ground line 23, the gate electrode 2 and the gate line 11 are formed by one patterning process. The term "same layer" as used herein refers to the relationship between layers formed in the same patterning process, and "same layer" does not mean that the thicknesses or heights of the film layers are the same in the cross-sectional view. That is, the second lead wire 22 and the ground line 23 are formed in different layers, so that the connection therebetween may be achieved through the via hole 18. Further, referring to FIG. 14, two ends of the second lead wire 22 may be respectively connected to two ground lines 23 at both ends of the array substrate, which facilitates the rapid discharge of the electrostatic charges.

Based on the array substrate provided in this embodiment, an embodiment of the present disclosure provides a method of manufacturing the above array substrate. Referring again to FIG. 10 to FIG. 13, the method is based on the method provided by the foregoing embodiments, and in the process for manufacturing the touch pattern metal layer, through the same patterning process, a plurality of lead wires 21 and at least one second lead wire 22 are manufactured while the light shielding layer 13 and the touch line 14 are manufactured. The arrangements and functions of the first lead wires 21 and the second lead wire 22 refer to the previous descriptions of the first lead wires 21 and the second lead wire 22, and details are not described herein.

According to the above method, the light shielding layer 13 may prevent the light from irradiating onto the channel 41 of the thin film transistor T, and the electrostatic charges generated by the rubbing of the spacers can be discharged by the first lead wire 21 and the second lead wire 22, thereby reducing the off-state current Ioll of the thin film transistor. Meanwhile, the manufacturing processes of the light shielding layer 13, the first lead wire 21 and the second lead wire 22 can be compatible with the manufacturing process of the touch line 14, there is no need to additionally add process steps for manufacturing the light shielding layer 13, the first lead wire 21 and the Process steps of the second lead 22.

An embodiment of the present disclosure provides a touch display device, which includes the array substrate as described in any of the foregoing embodiments.

Since the off-state current Ioff of the thin film transistor in the array substrate provided in the foregoing embodiments is small, the display quality of the touch display device in this embodiment is great.

It should be noted that the touch display device in this embodiment may be any product or component having a display function and driven by a thin film transistor, such as a liquid crystal panel, an electronic paper, an organic light-emitting diode (abbreviated as OLED) panel, a mobile phone, a tablet computer, a television, a display, a notebook computer, a digital photo frame, a navigator and the like.

The above description is only the specific embodiments of the present disclosure, the scope of protection of the present disclosure is not limited thereto, and any change or replacement that can be easily conceived by those skilled in the art within the technical scope of the present disclosure should fall within the scope of protection of the present disclosure. Therefore, the scope of protection of the present disclosure should be determined by the scope of the claims.

The above description is only the specific embodiment of the present disclosure, but the scope of protection of the present disclosure is not limited thereto, and any change or replacement that can be easily conceived by those skilled in the art within the technical scope of the present disclosure is It should be covered within the scope of protection of the present disclosure. Therefore, the scope of protection of the present disclosure should be determined by the scope of the claims.

What is claimed is:

1. An array substrate comprising:
   a base substrate;
   a plurality of thin film transistors on the base substrate;
   a plurality of light shielding layers on a side of the plurality of thin film transistors facing away from the base substrate; and
   a lead wire configured to ground the plurality of light shielding layers,
   wherein each thin film transistor comprises an active member, at least a portion of the active member serves as a channel of the thin film transistor, and an orthogonal projection of each of the light shielding layers on the base substrate at least partially overlaps an orthogonal projection of the channel of one of the plurality of thin film transistors on the base substrate, and
   wherein the plurality of light shielding layers are arranged in an array, and the lead wire comprises:
      a plurality of first lead wires, wherein each of the first lead wires extends in a first direction for electrically connecting at least two light shielding layers in one row; and
      at least one second lead wire extending in a second direction crossing the first direction for electrically connecting at least one of the plurality of first lead wires, the second lead wire being electrically connected with a ground line.

2. The array substrate of claim 1 further comprising:
   a plurality of touch lines on the side of the plurality of thin film transistors facing away from the base substrate,
   wherein the plurality of light shielding layers and the plurality of touch lines are disposed in the same layer and made of the same material.

3. The array substrate of claim 2, wherein the plurality of light shielding layers are electrically insulated from the plurality of touch lines.

4. The array substrate of claim 1 further comprising:
a plurality of gate lines extending in the first direction,
wherein an orthogonal projection of each of the plurality of first lead wires on the base substrate does not overlap an orthogonal projection of any of the plurality of gate lines on the base substrate.

5. The array substrate of claim 4, wherein the ground line and the plurality of gate lines are disposed in the same layer and made of the same material, and the at least one second lead wire is electrically connected to the ground line through a via hole.

6. The array substrate of claim 4, wherein a line width of each of the plurality of first lead wires is smaller than a line width of each of the plurality of gate lines.

7. The array substrate of claim 1 further comprising:
a plurality of data lines extending in the second direction,
wherein an orthogonal projection of the at least one second lead wire on the base substrate does not overlap an orthogonal projection of any of the plurality of data lines on the base substrate.

8. The array substrate of claim 7, wherein a line width of the at least one second lead wire is smaller than a line width of each of the plurality of data lines.

9. The array substrate of claim 1 further comprising:
a plurality of touch lines on the side of the plurality of thin film transistors facing away from the base substrate and extending in the second direction,
wherein the plurality of light shielding layers, the lead wire and the plurality of touch lines are disposed in the same layer and made of the same material, and the at least one second lead wire is disposed between each two adjacent touch lines so that the plurality of first lead wires does not cross the plurality of touch lines.

10. The array substrate of claim 1, wherein the orthogonal projection of each of the light shielding layers on the base substrate completely covers the orthogonal projection of the channel of one of the plurality of thin film transistors on the base substrate.

11. A display device comprising the array substrate of claim 1.

12. The array substrate of claim 1 further comprising:
a plurality of touch lines on the side of the plurality of thin film transistors facing away from the base substrate,
wherein the plurality of light shielding layers, the lead wire, and the plurality of touch lines are disposed in the same layer and made of the same material.

13. A method of manufacturing an array substrate, comprising:
providing a base substrate;
forming a plurality of thin film transistors on the base substrate;
forming a plurality of light shielding layers on a side of the plurality of thin film transistors facing away from the base substrate; and
forming a lead wire on the side of the plurality of thin film transistors facing away from the base substrate,
wherein each thin film transistor comprises an active member, at least a portion of the active member serves as a channel of the thin film transistor, and an orthogonal projection of each of the light shielding layers on the base substrate at least partially overlaps an orthogonal projection of the channel of one of the plurality of thin film transistors on the base substrate,
wherein the plurality of light shielding layers are grounded by the lead wire,
wherein the plurality of light shielding layers are arranged in an array, and
wherein forming the lead wire on the side of the plurality of thin film transistors facing away from the base substrate comprises:
forming a plurality of first lead wires extending in a first direction and at least one second lead wire extending in a second direction through one patterning process,
wherein the first direction crosses the second direction, each of the first lead wires is configured to electrically connect at least two light shielding layers in one row, the at least one second lead wire is configured to electrically connect at least one of the plurality of first lead wires, and the at least one second lead wire is grounded.

14. The method of claim 13 further comprising:
forming a plurality of touch lines on the side of the plurality of thin film transistors facing away from the base substrate,
wherein the plurality of light shielding layers and the plurality of touch lines are formed of the same material through one patterning process.

15. The method of claim 13 further comprising:
forming a plurality of touch lines on the side of the plurality of thin film transistors facing away from the base substrate,
wherein the plurality of light shielding layers, the lead wire and the plurality of touch lines are formed of the same material through one patterning process.

* * * * *